United States Patent [19]
Hierold

[11] Patent Number: 5,962,912
[45] Date of Patent: *Oct. 5, 1999

[54] POWER SEMICONDUCTOR COMPONENT WITH MONOLITHICALLY INTEGRATED PRECISION RESISTOR AND METHOD FOR THE MANUFACTURE THEREOF

[75] Inventor: Christofer Hierold, Munich, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/537,133

[22] Filed: Sep. 29, 1995

[30] Foreign Application Priority Data

Sep. 29, 1994 [DE] Germany ............... 44 34 893

[51] Int. Cl.⁶ .................................................. H01L 29/00
[52] U.S. Cl. ........................................... 257/537; 257/341
[58] Field of Search .................................. 257/341, 342, 257/350, 351, 358, 360, 363, 379, 533, 536, 537

[56] References Cited

U.S. PATENT DOCUMENTS

| | | | |
|---|---|---|---|
| 3,914,127 | 10/1975 | Buss et al. ................................. 96/36 |
| 4,455,739 | 6/1984 | Hynecek ................................. 257/247 |
| 4,530,852 | 7/1985 | Birnbreier et al. ..................... 427/102 |
| 4,931,844 | 6/1990 | Zommer .................................. 257/401 |
| 5,034,796 | 7/1991 | Zommer . | |
| 5,061,863 | 10/1991 | Mori et al. . | |
| 5,130,767 | 7/1992 | Lidow et al. ........................... 257/341 |
| 5,153,696 | 10/1992 | Kayama . | |
| 5,365,085 | 11/1994 | Tokura et al. .......................... 257/578 |
| 5,392,187 | 2/1995 | Baliga .................................... 257/529 |
| 5,432,371 | 7/1995 | Denner et al. .......................... 257/360 |
| 5,479,044 | 12/1995 | Narahara et al. ....................... 257/536 |
| 5,528,063 | 6/1996 | Blanchard .............................. 257/341 |
| 5,548,134 | 8/1996 | Tailliet .................................... 257/546 |

FOREIGN PATENT DOCUMENTS

| | | |
|---|---|---|
| 0390485 | 10/1990 | European Pat. Off. . |
| 0 559 910 A1 | 9/1993 | European Pat. Off. . |
| 0595404 | 5/1994 | European Pat. Off. . |

OTHER PUBLICATIONS

Japanese Abstract, Publication No. 61075535, Publication Date Apr. 17, 1986.
V. W. Taeger, Die Technik integrierter Schaltungen, Industrie Elektrik+Elektronik, Jan. 11, 1996, Nr. B 1/2, pp. 1–3.

*Primary Examiner*—J. Carroll
*Attorney, Agent, or Firm*—Hill & Simpson

[57] ABSTRACT

A power semiconductor component having a cell structure includes a metallic resistance track that is insulated from the semiconductor body of the power semiconductor component and from a control electrode by a non-conductive layer. The resistance track is provided in a lateral region between cells of the power semiconductor. The active area of the component is not made smaller by the presence of the resistance track and the resistance track is produced simultaneously with a metallic layer of the component which provides electrical contact with a main electrode of the power semiconductor so that no additional manufacturing steps are required for adding the resistive track.

3 Claims, 2 Drawing Sheets

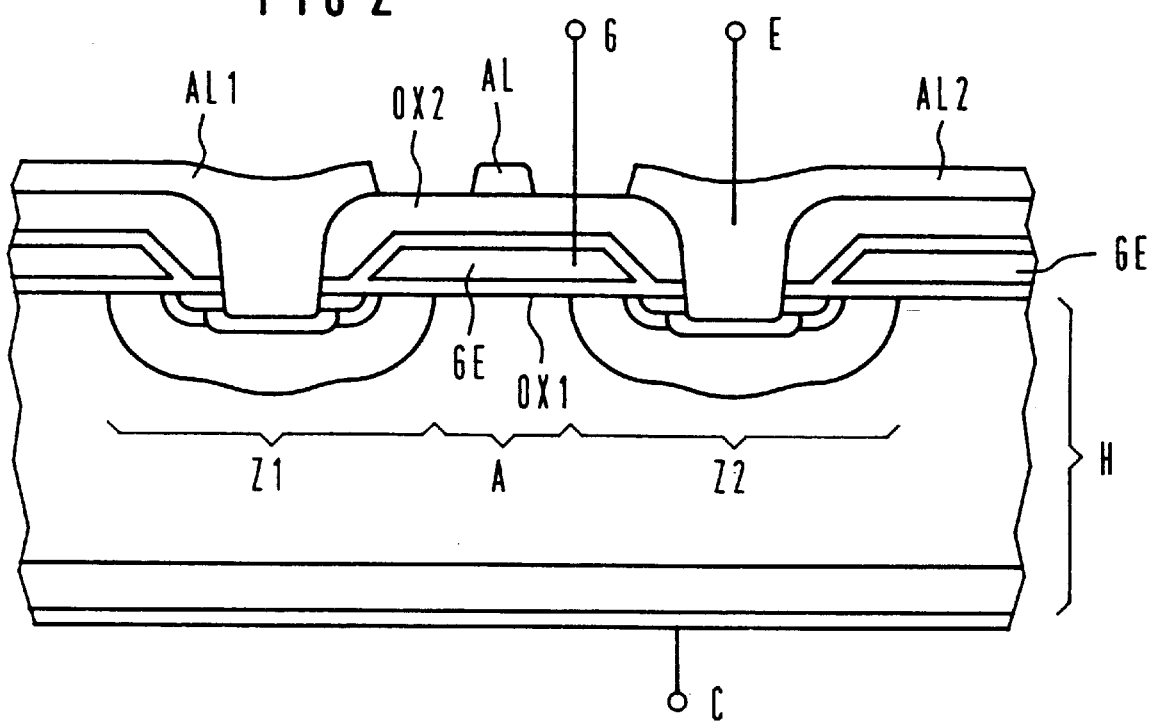
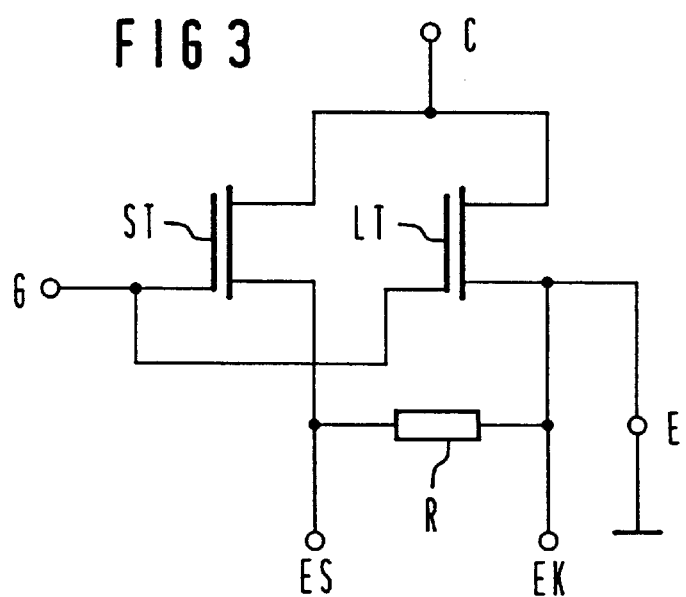

POWER SEMICONDUCTOR COMPONENT WITH MONOLITHICALLY INTEGRATED PRECISION RESISTOR AND METHOD FOR THE MANUFACTURE THEREOF

BACKGROUND OF THE INVENTION

1. Field of the Invention

The present invention relates generally to a power semiconductor component and, in particular, to a power semiconductor having a precision resistor.

2. Description of the Related Art

The European Patent Application, publication number 0 390 485, discloses a MOS pilot structure for a transistor with an insulated gate, whereby a metallic contact strip that connects, first, the terminals of the cells of the MOS pilot structure and, second, the MOS pilot structure to a metallic terminal region for an external precision resistor is provided between the cells of the transistor. A disadvantage of the device is that the precision resistor must be externally attached and the measuring precision and the dynamic behavior of the pilot structure can be negatively influenced by the leads, parasitic resistors and inductances. When the precision resistor is used for temperature measurement, then the temperature in the proximity of the endangered barrier layers cannot be reliably acquired with an external resistor, whereby the measured temperature partly deviates by up to 20 percent from the actual temperature.

SUMMARY OF THE INVENTION

An object of the invention is to provide a power semiconductor component wherein the disadvantages set out above are avoided, without the active area being thereby made smaller given the same semiconductor area and without additional process steps being required in the manufacture of the power semiconductor component.

This and other objects and advantages are inventively achieved by a power semiconductor component having a cell structure, whereby a metallic resistance track is provided in a lateral region between cells of the power semiconductor component for forming a precision resistor that is insulated from the semiconductor body and from a control electrode by at least one non-conductive layer; and whereby the respective cells to the left and right of the resistance track are spaced by the same regular cell spacing from one another as the other cell structures of the semiconductor component.

The power semiconductor component further has a metallic layer for contacting a main electrode of the power semiconductor component which is connected to the resistance track at one location and the resistance track is composed of the same material as the metallic layer for contacting.

The resistance track is meander shaped in the preferred embodiment. The resistance track is preferably essentially composed of aluminum.

A method for manufacturing a power semiconductor component is also provided, including the step of producing a resistance track simultaneously with the metallic layer for contacting a main electrode.

BRIEF DESCRIPTION OF THE DRAWINGS

The invention shall be set forth in greater detail below with reference to the drawings.

FIG. 2 is a sectional view along a section line 2–2' identified in FIG. 1; and

FIG. 3 is an electrical equivalent circuit diagram of the present power semiconductor component.

DETAILED DESCRIPTION OF THE PREFERRED EMBODIMENTS

Figure 1:
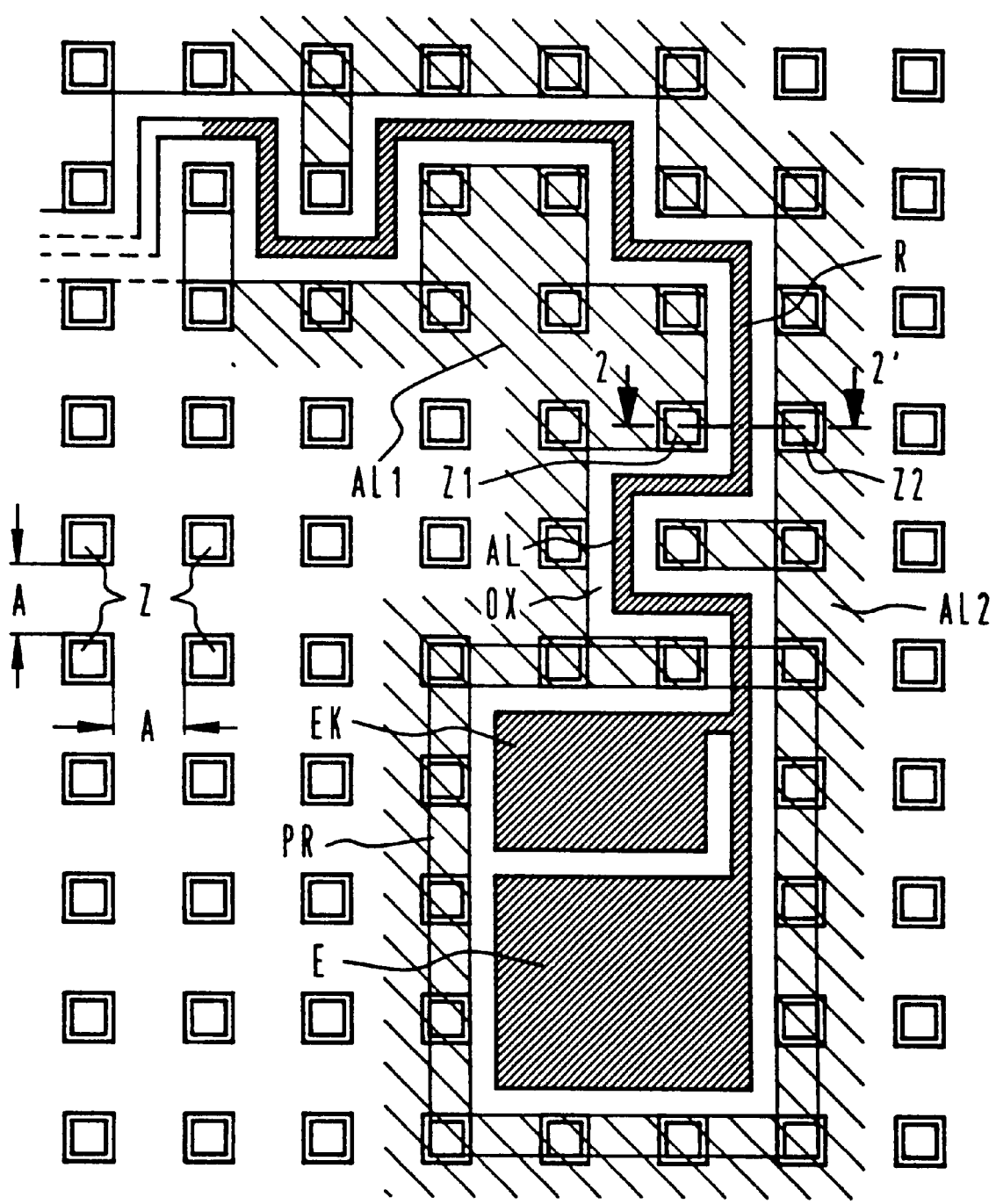
FIG. 1 is a portion of an inventive power semiconductor component in a plan view.

FIG. 1 shows a plan view of a power semiconductor component according to the present invention which as a cell structure that includes an arrangement of cells Z.

All of the cells Z except the cells in the immediate proximity of contacting regions E and EK have the same regular cell spacing A from one another. This regular mutual spacing of the cells includes the cells Z that are in the immediate proximity of a metallic resistance track AL. The regular cell structure is, thus, interrupted only by the contacting regions (also referred to as bond pads, which are provided for connection of bond wires) E and EK so that the only active area of the power semiconductor component that is lost is the portion for the contacting regions. No active area of the power semiconductor is lost due to the addition of the resistance track.

The contacting regions, or bond pads, EK and E are preferably separated from the cells Z by a $p^+$-doped ring or border PR which is implanted into the semiconductor body and which surrounds the contacting regions. The resistance track AL is separated from the semiconductor body by a non-conductive layer OX, which is for example a $SiO_2$ layer.

When what is referred to as a four-wire current measuring technique is used for current measurement of the power semiconductor, the four-wire current measurement being used to avoid measuring errors due to contact resistances, then, in addition to the main contacting region E, the additional contacting region EK for contact by what is referred to as a Kelvin terminal is provided. When the additional contacting region is present, it is likewise connected to the resistance track AL. A section line 2–2' through the cell Z1, the resistance track AL and the cell Z2 is indicated in FIG. 1, and the sectional view along that line is shown in FIG. 2.

FIG. 2 shows a semiconductor body H that includes two cells Z1 and Z2 at the cell spacing A from one another. Gate electrodes G which are separated from the semiconductor body H by a non-conductive oxide layer OX1, which is, for example, a $SiO_2$ layer, are arranged on the structured surface of the semiconductor body H in a region overlapping the cell spacing A, i.e., the gate electrodes G are between the cells. Further, a central region of the cells Z1 and Z2 is connected via clearances, or openings, in a second oxide layer OX2 and in the first oxide layer OX1 to the metallic contacting layer AL1 or, respectively, AL2 that, for example, is composed of aluminum. The resistance track AL that, for example, is also composed of aluminum is located in a lateral region between the cells Z1 and Z2 above the gate electrode GE and is insulated from the latter or, respectively, from the semiconductor body H by the non-conductive oxide layers OX1 and OX2.

The resistance track of the present invention may be, for example, used for current measurement or for temperature measurement. Both in the case of an integrated resistor for measuring current as well as in the case of an integrated resistor for measuring temperature, the resistance track AL can, for example, be connected at one end to a terminal region E of a main electrode of the power semiconductor component, as shown in FIG. 1. Thus, no additional connection pad is required for electrical connection to the resistive track, so that active area of the power semiconductor component which would otherwise be lost to an additional connection pad for the resistive track is saved in the case the present resistive track. This is particularly true when the resistive track is used for temperature measurement.

In the case where the integrated resistor is used for temperature measurement, however, both ends of the resistance track AL can be connection to a respective, separate contacting region for the resistor R and these contacting regions can in turn be wired to an external source of constant current.

When the precision resistor R is employed as a temperature sensor, it is to be preferably provided at the hottest location of the power semiconductor. Since the resistance track AL is provided at interruptions in the metallic contact layer of a main terminal, for example of an emitter terminal E of the cells, care must be exercised to see that no isolated islands of cells arise which are not connected to the connection pads. Also, the flow of current is to be locally concentrated on the surface of the power semiconductor device.

FIG. 3 is an electrical equivalent circuit diagram that shows the present power semiconductor component in the form of an IGBT (Isolated Gate Bipolar Transistor), whereby the IGBT component is composed of a load transistor LT and of a sensor transistor ST. The sensor transistor ST and the load transistor LT are wired as a current mirror, whereby the load transistor is composed of about 1,000 times more cells than the sensor transistor. The collector terminals of the two transistors LT and ST are connected to a common collector terminal C of the power semiconductor component and the gate terminals of the two transistors are connected to a common gate terminal G of the power semiconductor component. The emitter terminal of the sensor transistor ST is conducted out as an external sensor terminal ES and the emitter of the load transistor LT is conducted out as an external gate terminal E that carries practically the entire load current and an external Kelvin terminal that carries only the test current. The sensor terminal ES is connected via the integrated resistor R to the emitter terminal E or, respectively, to the Kelvin terminal EK.

The cell spacing A between the cells amounts, for example, to 50 $\mu$m and the width of the resistance track amounts, for example, to 5 $\mu$m so that the resistance track AL fits easily between the cells. The length of the resistance track AL is defined by the value of the desired resistance and can thus be appropriately matched to the requirements of the circuit. A typical value for the sheet resistivity of the resistance track is 5 mOhm/square. The size of the bond pads, or connection regions, amounts, for example, to 50 $\mu$m×100 $\mu$m. Given the use of resistance tracks having a low basic resistance, i.e., for example, 10 through 100 Ohms, the four-wire current measuring technique is preferred over the two-wire current measuring technique since the measured result is falsified in the two wire technique by the contact resistances of the contacts.

The resistance track AL is preferably be conducted between the cells meanderlike. The meander shape of the resistance track, when carefully laid out, prevents any cells from being electrically separated from the connection regions.

Power semiconductor components according to the present invention are, preferably, transistors with an insulated gate such as, for example, power MOSFETs and IGBTs (Isolated Gate Bipolar Transistor).

Advantageously, the resistance track AL is produced simultaneously with the metallic contact AL1 and AL2 of the cells Z1 and Z2 in the same process step. Therefore, no additional step is required for the addition of the resistance track.

Although other modifications and changes may be suggested by those skilled in the art, it is the intention of the inventors to embody within the patent warranted hereon all changes and modifications as reasonably and properly come within the scope of their contribution to the art.

We claim:

1. A power semiconductor component, comprising:

a semiconductor body;

a control electrode on said semiconductor body;

an arrangement of cell structures of power semiconductor elements on said semiconductor body, said cell structures being spaced at a regular cell spacing from one another;

a metallic resistance track in a lateral region between said cell structures, said metallic resistance track forming a precision resistor;

at least one non-conductive layer that insulates said metallic resistance track from the semiconductor body and from the control electrode;

wherein said cell structures to each side of said metallic resistance track are spaced from one another by said regular cell spacing so that said regular cell spacing is not interrupted by said metallic resistance track; and wherein said resistance track is meander shaped.

2. A power semiconductor component as claimed in claim 1, further comprising:

a main electrode of said power semiconductor component; and a metallic layer for electrically connecting said main electrode to said resistance track at one location, said metallic layer being of a same material as said resistance track.

3. A power semiconductor component as claimed in claim 1, wherein said resistance track is composed essentially of aluminum.

* * * * *